(12) United States Patent
Mishiro et al.

(10) Patent No.: US 7,665,367 B2
(45) Date of Patent: Feb. 23, 2010

(54) METHOD AND APPARATUS FOR MEASURING SHAPE OF HEAT TREATMENT JIG

(75) Inventors: Hitoshi Mishiro, Chiyoda-ku (JP); Atsushi Nakamura, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 188 days.

(21) Appl. No.: 12/020,974

(22) Filed: Jan. 28, 2008

(65) Prior Publication Data
US 2008/0178685 A1    Jul. 31, 2008

(30) Foreign Application Priority Data
Jan. 29, 2007    (JP)    ............. 2007-018393

(51) Int. Cl.
*G01N 3/00* (2006.01)
(52) U.S. Cl. ....................................... 73/856
(58) Field of Classification Search .............. 73/856
See application file for complete search history.

(56) References Cited

U.S. PATENT DOCUMENTS 6,796,439 B2 * 9/2004 Araki ............... 211/41.18
7,112,812 B2 * 9/2006 Schauer ............ 250/559.29
7,163,393 B2 * 1/2007 Adachi ................. 432/253
7,169,018 B2 * 1/2007 Kundracik ............... 451/8
7,230,680 B2 * 6/2007 Fujisawa et al. .......... 355/72
7,442,038 B2 * 10/2008 Adachi ................. 432/259
7,474,386 B2 * 1/2009 Fujisawa et al. .......... 355/77

FOREIGN PATENT DOCUMENTS

| JP | 7-45691 | 2/1995 |
| JP | 9-199438 | 7/1997 |
| JP | 2005-101161 | 4/2005 |

* cited by examiner

*Primary Examiner*—Lisa M Caputo
*Assistant Examiner*—Freddie Kirkland, III
(74) *Attorney, Agent, or Firm*—Oblon, Spivak, McClelland, Maier & Neustadt, L.L.P.

(57) ABSTRACT

A method for measuring the shape of a heating treatment jig to be held by a holding portion of a vertical heat treatment apparatus includes measuring the shape of the heat treatment jig in a state that the position of a supporting portion for supporting the heat treatment jig is set to be the same as the position of the holding portion for the heat treatment jig in the vertical heat treatment apparatus. The heat treatment jig can be used for placing a semiconductor wafer to be subjected to heat treatment.

6 Claims, 11 Drawing Sheets

(A)

(B)

(A)

(B)

METHOD AND APPARATUS FOR MEASURING SHAPE OF HEAT TREATMENT JIG

BACKGROUND OF THE INVENTION

1. Field of the Invention

The present invention relates to a heat treatment jig to be used for carrying out a heat treatment in a vertical heat treatment apparatus to be used in a semiconductor manufacturing process, and to a method and an apparatus for measuring the shape of such a heat treatment jig, to confirm that the jig has a shape reducing crystal defect or damage of a semiconductor wafer.

2. Discussion of Background

A process for treating a semiconductor wafer (hereinafter referred to as a "wafer") in a semiconductor manufacturing process, includes a heat treatment process using high temperature such as an annealing treatment, an oxidation treatment or a diffusion treatment, and in such a heat treatment process, a vertical heat treatment apparatus is used according to upsizing of a wafer.

In this type of vertical heat treatment apparatus, a holding jig named "boat" is used, which is constituted by a pair of end plates 1, 1 positioned at the top and the bottom as shown in FIG. 1, and three or four supporting rods 2, 2 . . . provided between the pair of end plates 1, 1, on which a plurality of grooves 4 is formed as shown in FIG. 2 for positioning a wafer 3. There has been a problem that in a case where a wafer 3 is held by such a boat and subjected to a heat treatment, since the weight of the wafer 3 is supported at contact portions with the grooves 4 of the boat, when a heat is applied to the wafer 3, there occurs a positioning shift due to a thermal expansion difference between the materials of the wafer 3 and the boat or due to deflection of the wafer 3 by its own weight, or there forms a shearing stress of the wafer 3 by its own weight, and they cause damages or crystal defects (slip) in the wafer 3.

In order to solve such problems, a method is proposed, in which instead of using grooves 4 for holding a wafer 3, a circular doughnut-shaped heat treatment jig 5 shown in Patent Document 1 and in FIG. 3 of this application, is used for holding the periphery of the wafer 3 as shown in FIG. 4, and the grooves 4 of the boat are used for supporting the periphery of the heat treatment jig 5 as shown in FIG. 5.

Further, as shown in Patent Document 2, when a wafer is placed on a heat treatment jig, the wafer is deflected by its own weight and a shearing stress is applied to a portion of the wafer in contact with the inner periphery of the jig, which causes crystal defects of the wafer, and the document proposes means for preventing such crystal defects.

Further, as means for more efficiently holding the periphery of a wafer, Patent Document 3 proposes a method of arranging contact portions of the outer periphery of the wafer so that they are outside a region for producing semiconductor devices, and a method of forming each wafer-holding surface into a tapered shape toward the center so as to have a line contact with the wafer instead of a face contact, to reduce occurrence of damages or crystal defects.

These heat treatment jigs are made of a material such as a fused quartz, a synthetic quartz, a sintered silicon carbide coated with the same material by CVD, a silicon carbide that is so-called solid product produced by a CVD method, silicon or carbon.

Patent Document 1: JP-A-7-45691
Patent Document 2: JP-A-9-199438
Patent Document 3: JP-A-2005-101161

However, in a semiconductor manufacturing process, a treatment such as an anneal treatment in which the heat treatment temperature is at least 1,200° C., becomes widely used and defect-free requirement for wafers becomes more strict, and consequently, more damages or crystal defects are detected even with a heat treatment jig having a conventionally proposed shape.

This is because such conventionally proposed shapes of heat treatment jigs are ones considering only deformation of a wafer but not considering deformation of the heat treatment jig itself by its own weight, or deformation of the heat treatment jig in a higher temperature region. Further, this is also because such shapes are ones only considering deformations in a radial direction but not considering deformation in a circumferential direction that is determined by the number, positions and the shape of grooves of a boat for holding the heat treatment jig itself.

Proposal of an optimum shape of heat treatment jig considering a deformation due to the heat treatment jig by its own weight or due to heat, can be determined by a simulation using e.g. a finite element method.

When a heat treatment jig having a shape also considering such a deformation by a simulation is produced, it is necessary to confirm whether the finished shape has a predetermined accuracy. In this step, a conventionally used three-dimensional measurement tool has a flat stage to be used for placing a heat treatment jig being an object to be measured, and accordingly, the heat treatment jig is deflected by its own weight to prevent accurate measurement. Further, in a case of point-contact type profiler, the heat treatment jig is deformed by a contact pressure to prevent accurate measurement. Further, in order to prevent the above-mentioned damages or crystal defects, it is essential to determine a three-dimensional shape of a surface of the heat treatment jig to be used for placing a wafer. However, on a flat stage, manufacturing accuracy of the opposite surface of the jig, more specifically, parallelism, may affect the measurement, and accurate measurement becomes difficult.

It is possible to adjust a measured shape considering these deformation or parallelism. However, such a adjustment requires excessive steps and significantly deteriorates productivity.

SUMMARY OF THE INVENTION

Considering the above circumstances, the present invention is made to solve the above problems, and it is an object of the present invention to provide in order to produce a heat treatment jig to be used for placing a wafer and to be used in a heat treatment apparatus in a semiconductor manufacturing process, a method and an apparatus for measuring the shape of the heat treatment jig, which can easily and accurately measure the jig to confirm the jig has a shape reducing damages or crystal defects of a wafer.

A first aspect of the present invention provides in order to achieve the above object, a method for measuring the shape of a heating treatment jig to be held by a holding portion of a vertical heat treatment apparatus and to be used for placing a semiconductor wafer to be subjected to heat treatment, the method being characterized in that the shape of the heat treatment jig is measured in a state that the position of a supporting portion for supporting the heat treatment jig is set to be the same as the position of the holding portion for the heat treatment jig in the vertical heat treatment apparatus.

A fourth aspect of the present invention provides an apparatus for measuring the shape of a heat treatment jig to be held by a holding portion of a vertical heat treatment apparatus and to be used for placing a semiconductor wafer to be subjected to heat treatment, the apparatus being characterized in that the position of a supporting portion for supporting the heat treatment jig is the same as the position of the holding portion for the heat treatment jig in the vertical heat treatment apparatus.

A second aspect of the present invention provides the method according to the first aspect, wherein the shape of the supporting portion for supporting the heat treatment jig is the same as the shape of the holding portion for the heat treatment jig in the heat treatment apparatus.

A fifth aspect of the present invention provides the apparatus according to the fourth aspect, wherein the shape of the supporting portion for supporting the heat treatment jig is the same as the shape of the holding portion for the heat treatment jig in the heat treatment apparatus.

A third aspect of the present invention provides the method according to the first or the second aspect, wherein means for measuring the shape of the heat treatment jig is non-contact type measurement means for measuring the heat treatment in non-contact manner.

A sixth aspect of the present invention provides the apparatus according to the above fourth or fifth aspect, wherein means for measuring the shape of the heat treatment jig is a non-contact type heat treatment means for measuring the heat treatment jig in a non-contact manner.

According to the invention of the first and fourth aspects, since the position of a supporting portion for a heat treatment jig is made to be the same as the position of a holding portion for the heat treatment jig in a vertical heat treatment apparatus at a time of shape measurement, deflection of the heat treatment jig by its own weight can be reproduced conveniently. Accordingly, at a time of producing a heat treatment jig to be used for placing a wafer and to be used in a vertical heat treatment apparatus in a semiconductor manufacturing process, it is easily and accurately measure the shape to confirm that the shape can reduce occurrence or damages or crystal defects in a wafer. Further, since the inclination and the parallelism with top surface of the heat treatment jig is determined not according to manufacturing accuracy of entire back surface but according to accuracy of portions in contact with the holding portion of the vertical heat treatment apparatus, it becomes possible to easily measure a manufacturing accuracy of a surface to be used for placing a wafer, in a state that the shape has little measurement error from the shape in actual use.

As described in the invention according to the aspects 2 and 5, it is preferred to make the shape of the supporting portion to be the same as the shape of the holding portion. Accordingly, it becomes possible to carry out a measurement in a state extremely close to a state of actual use, in which a difference of deflection according to the width or the depth of a groove in the holding portion is considered. Further, considering a deflection of groove wall, it is more preferred to use a supporting portion having a shape of groove wall. Further, Young's modulus changes according to the material, it is preferred that the supporting portion is made of the same material as the material of the holding portion.

Meanwhile, as a measurement tool for measuring the shape and accuracy of such a jig, a three-dimensional measurement tool using an electric dial gauge, is commonly used, but in a case of such a contact type measurement means, the heat treatment jig is deflected by a contact pressure by the dial gauge, to prevent accurate measurement.

For this reason, as shown in the invention according to the third and the sixth aspects, instead of such contact type measurement means, a non-contact type measurement means is preferably equipped. By this method, accurate measurement becomes possible. As such a non-contact type measurement method, a displacement meter using a laser or a static capacitance, or an optical interferometer may be used.

DETAILED DESCRIPTION OF THE PREFERRED EMBODIMENTS

From now, preferred embodiments of the method and the apparatus for measuring the shape of heat treatment jig according to the present invention, is described in detail with reference to the attached drawings.

Figure 1:
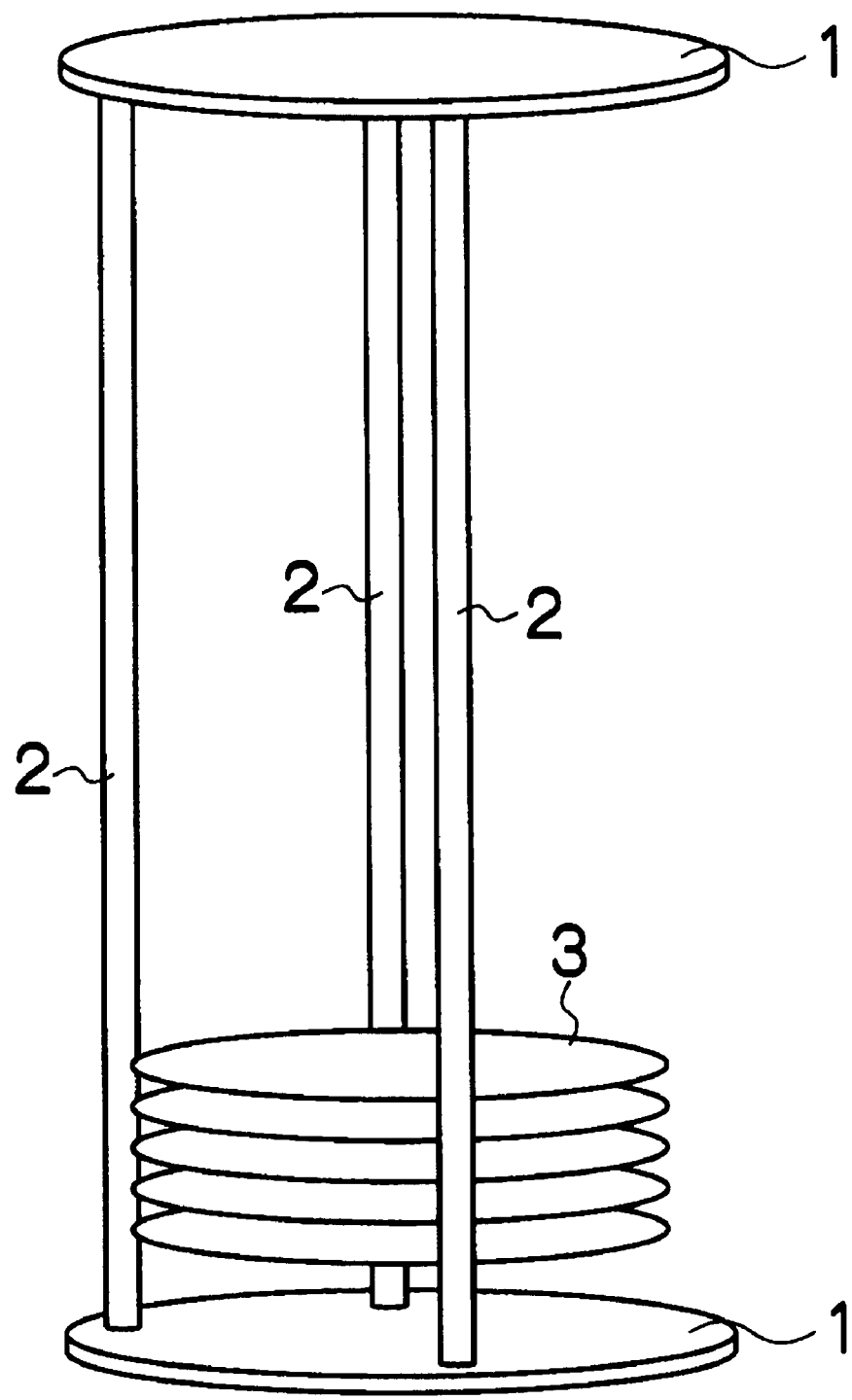
FIG. 1 is a schematic perspective view showing a holding jig to be used in a vertical heat treatment apparatus.
Figure 2:
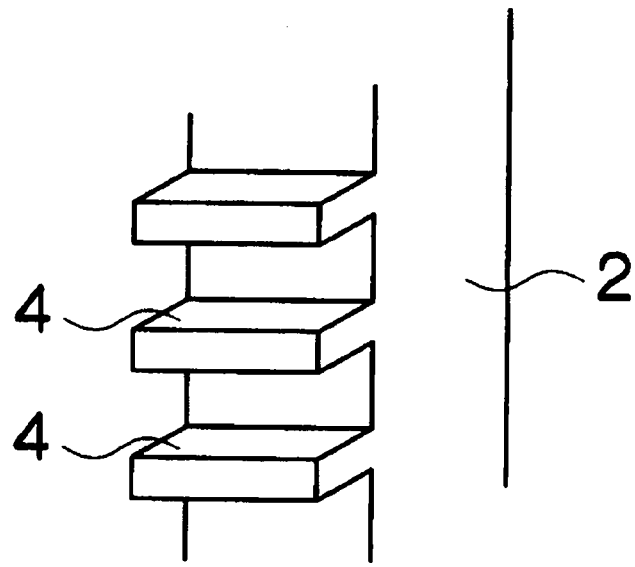
FIG. 2 is a schematic perspective view showing a holding groove as a part of a holding jig.
Figure 3:
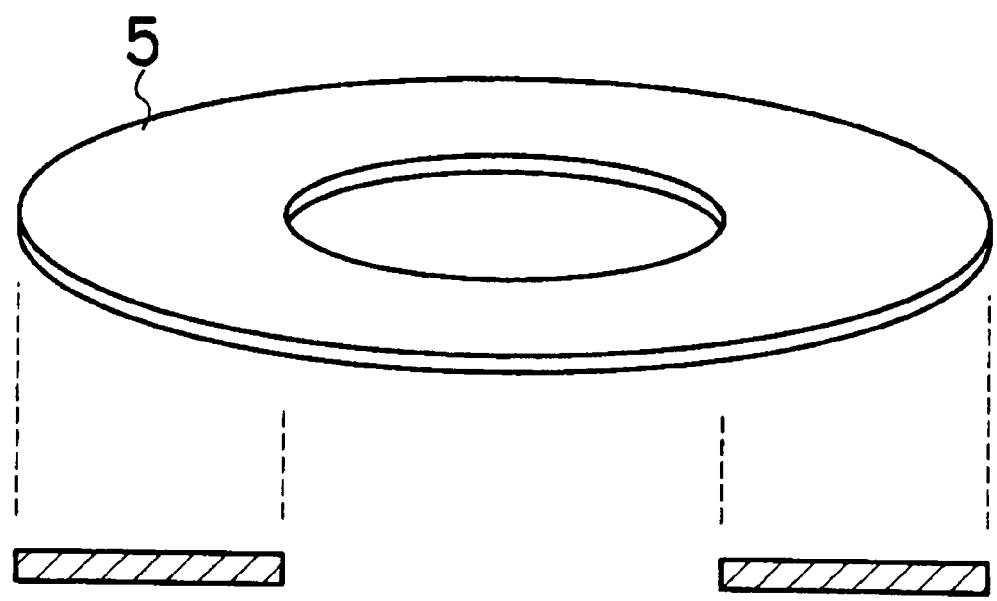
FIG. 3 is a schematic perspective view of a heat treatment jig.
Figure 4:
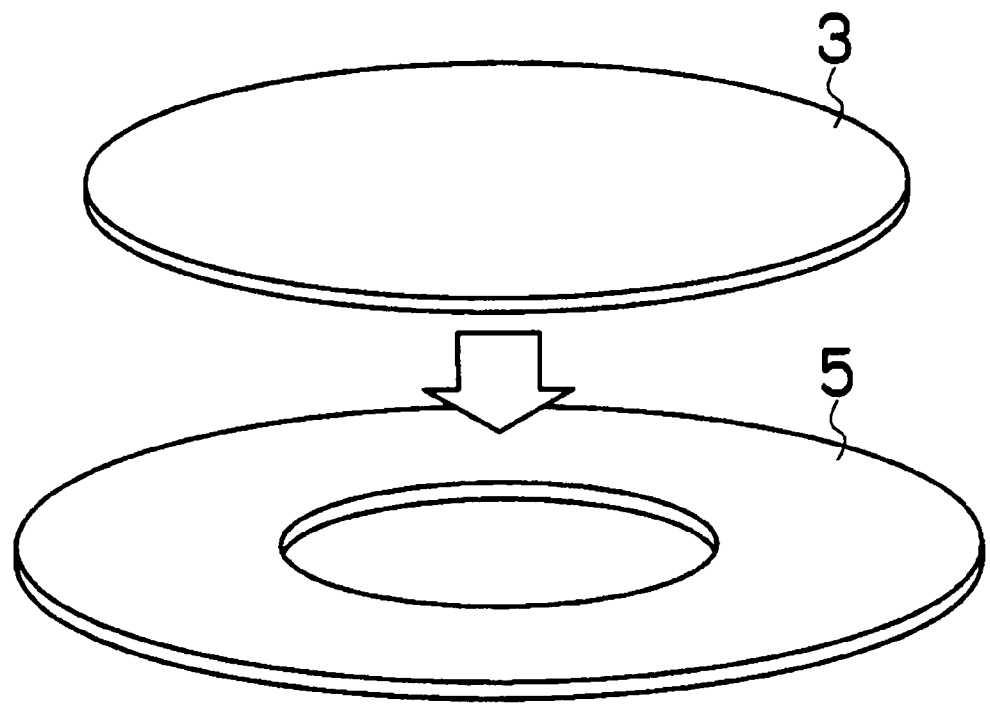
FIG. 4 is a schematic perspective view showing a method for using a heat treatment jig.
Figure 5:
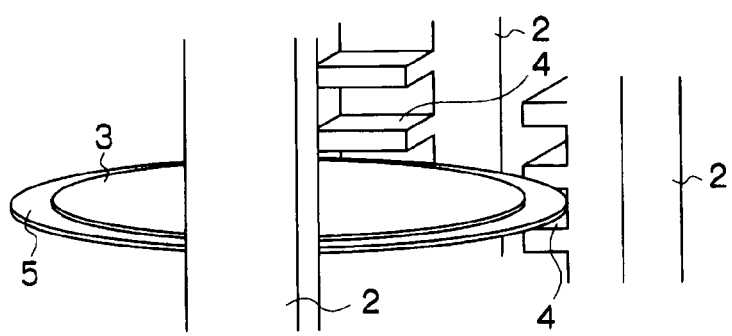
FIG. 5 is a schematic perspective view showing a method of holding a heat treatment jig by a holding groove of a holding jig.
Figure 6:
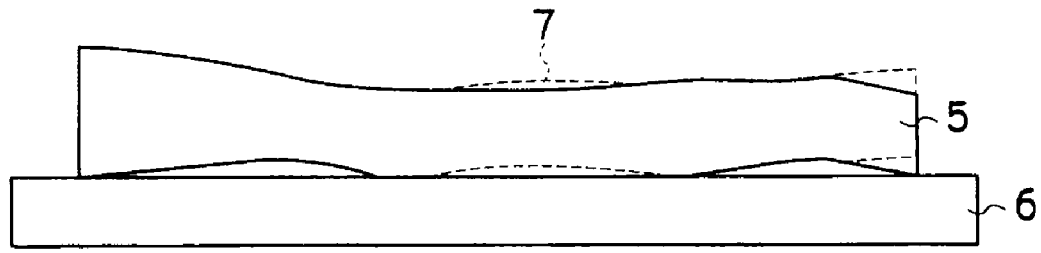
FIG. 6 is a schematic view showing a method of placing a heat treatment jig on a conventional measurement tool.

First of all, before describing the embodiment, prior art is generally described as a comparison for the embodiments of the present invention. FIG. 6 shows a method for placing a heat treatment jig 5 on a conventionally used apparatus (stage 6) for measuring the jig. In this case, the shape accuracy of the top surface of the heat treatment jig 5 to be measured, is one containing the shape accuracy of the back side, parallelism between the top side and back side of the heat treatment jig 5, and determination due to deflection of the heat treatment jig 5 by its own weight, wherein the deformation due to deflection by its own weight is one further restricted by the shape of the stage 6. Here, the reference numeral 7 indicates a heat treatment jig 5 that is not deflected.

FIGS. 7(A) and 7(B) are a side view and a plan view respectively, showing a method for placing a heat treatment jig 5 on an apparatus (stage 6) for measuring the jig, according to this embodiment of the present invention. Since the heat treatment jig 5 is held at the same holding positions and number of those of holding portions of a vertical heat treatment apparatus on which the heat treatment jig 5 is placed, it is possible to measure the shape of the heat treatment jig 5 without restriction to its deformation by the surface of the stage 6, so that the measurement is made in a state that the deflection due to its own weight is extremely close to a deflection in actual use.

EXAMPLE 1

Figure 12:
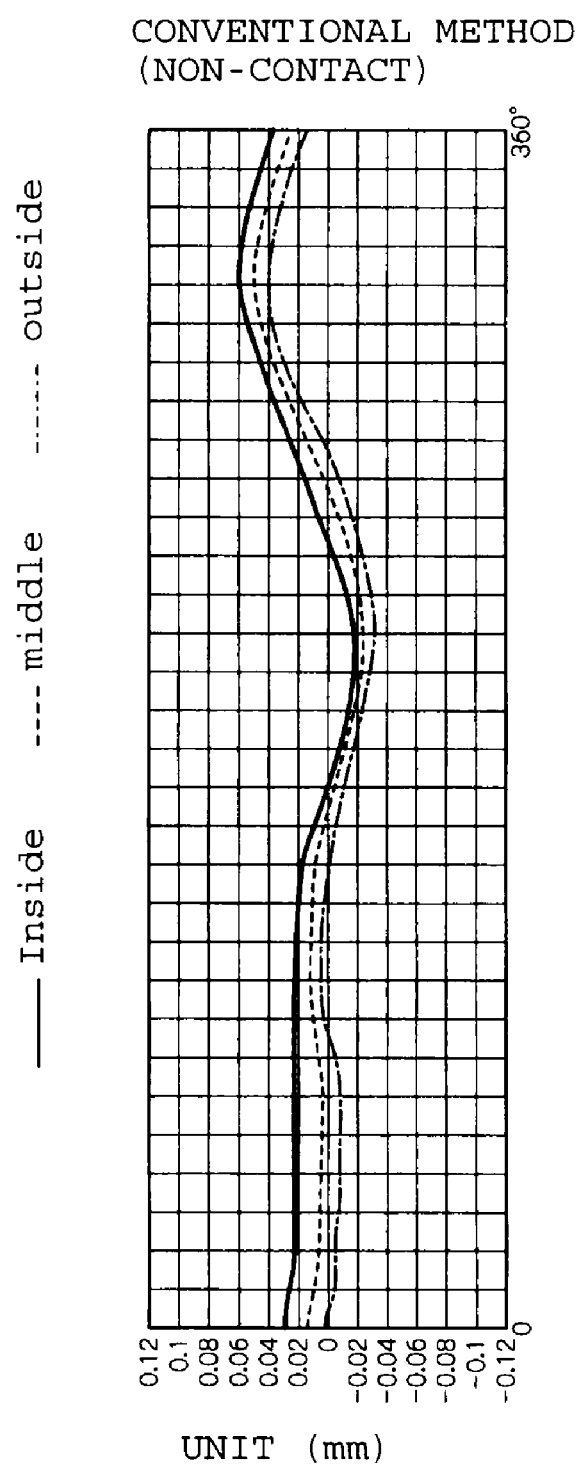
FIG. 12 is a graph for comparing measurement results of conventional measurement methods.
Figure 13:
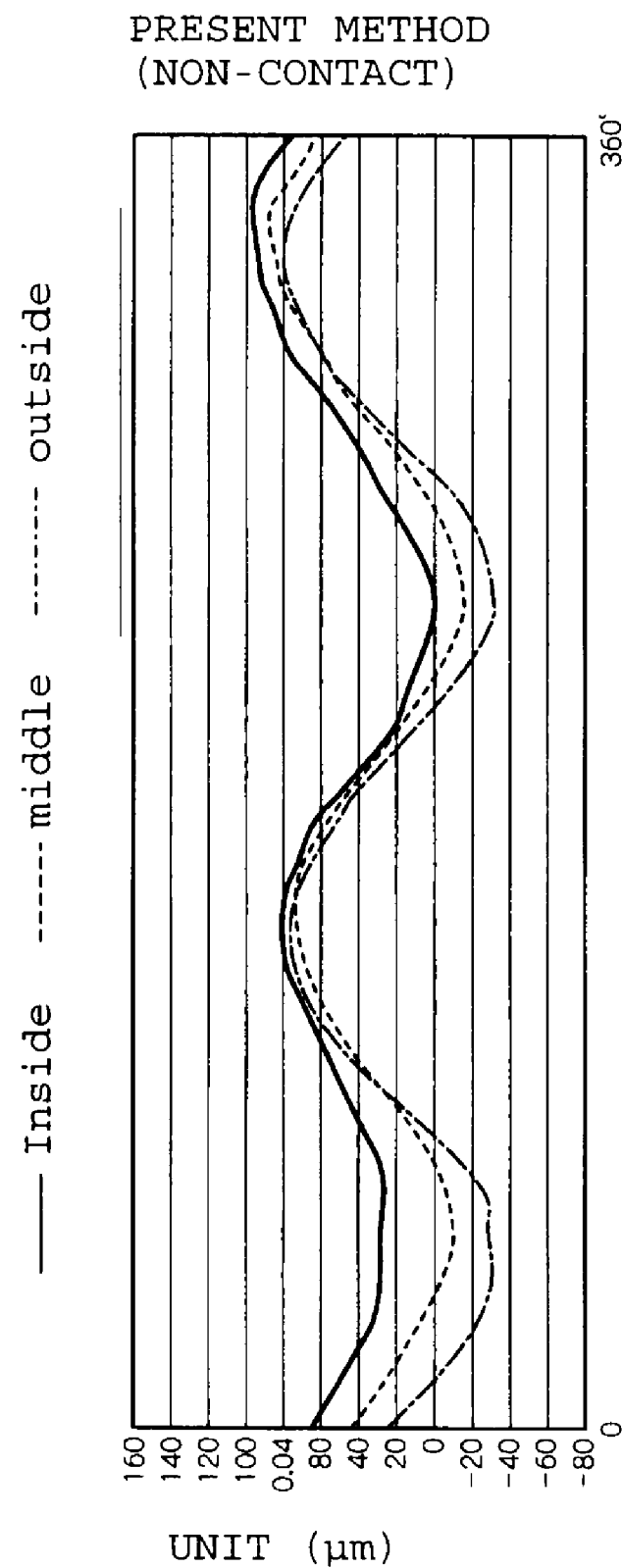
FIG. 13 is a graph showing comparison of measurement results of the present invention.

As a comparison result of measurement of these two methods, the graph of FIG. 12 shows a measurement result of a heat treatment jig 5 by a conventional measurement method, and the graph of FIG. 13 shows a measurement result of the same heat treatment jig 5 by the method of the present invention. In FIGS. 12 and 13, a lateral axis represents an angle position in a circumferential direction of the heat treatment jig 5, and a vertical axis represents displacement amount (deflection amount) in relation to the angular position in the circumferential direction.

Figure 7:
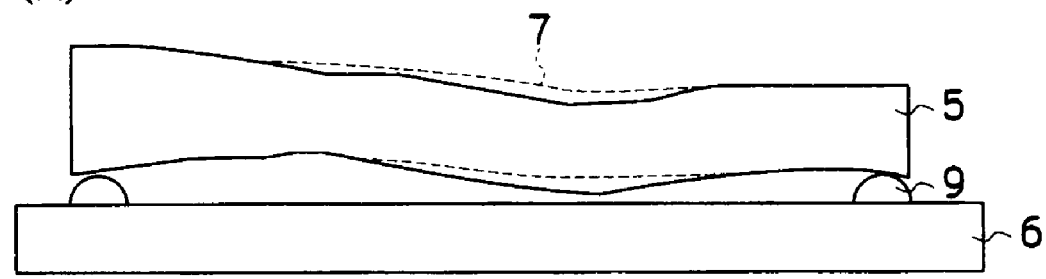
FIGS. 7(A) and 7(B) are schematic views showing a method of placing a heat treatment jig on a measurement tool of the present invention.
Figure 7:
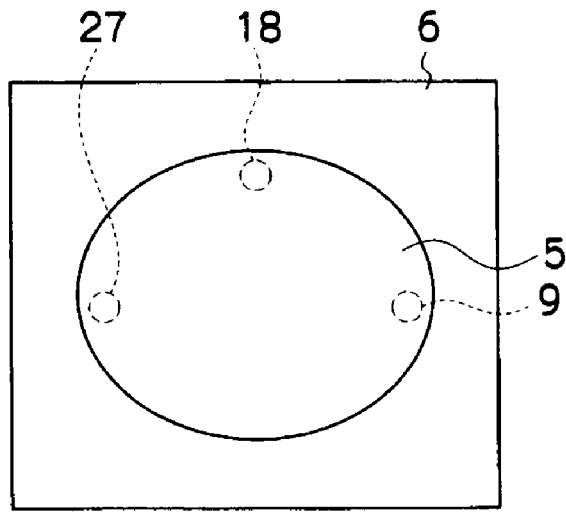

A heat treatment jig 5 used in these measurements has an outer diameter of 320 mm, an inner diameter of 200 mm and a thickness of 2.5 mm, its material is a sintered SiC coated with CVD-SiC of 50 μm thick. In the conventional measurement, a flatness tester (model: KS990X) manufactured by Anritsu Corporation is used as a measurement apparatus, and measurement of the heat treatment jig 5 is carried out as it was directly placed on a flat stage 6 as shown in FIG. 6. In the measurement of the present invention, as shown in FIG. 7, SiC supporting portions 9, 18 and 27 each formed to have a spherical shape having a radius of 10 mm, are arranged at three positions at intervals of 90° on the stage 6 of the same measurement apparatus as above, and the heat treatment jig 5 was placed on the stage and measured.

Figure 11:
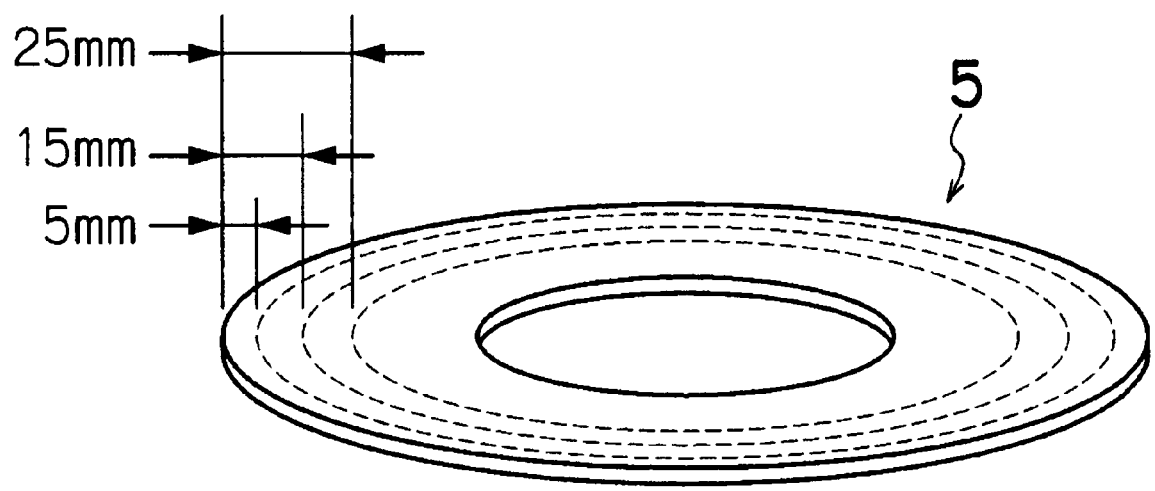
FIG. 11 is a perspective view of a heat treatment jig showing measurement positions selected for carrying out the present invention.

Further, in each of these methods, the measurement points were 36 points at the same intervals on each of circles at 5 mm (outside), 15 mm (middle) and 25 mm (inside) respectively from the outer periphery of the heat treatment jig 5 as shown in FIG. 11, and the measurements were plotted on the graph.

This measurement result indicates that as compared with a case (refer to FIG. 12) of measurement on a flat stage 6, in the result (refer to FIG. 13) by the measurement method of this embodiment, the wave shape in the circumferential direction is more emphasized and the difference between the outer periphery and the inner periphery of the heat treatment jig 5 is increased. Accordingly, in the measurement method of this embodiment, it is possible to accurately measure the deflection amount of the heat treatment jig 5.

Figure 8:
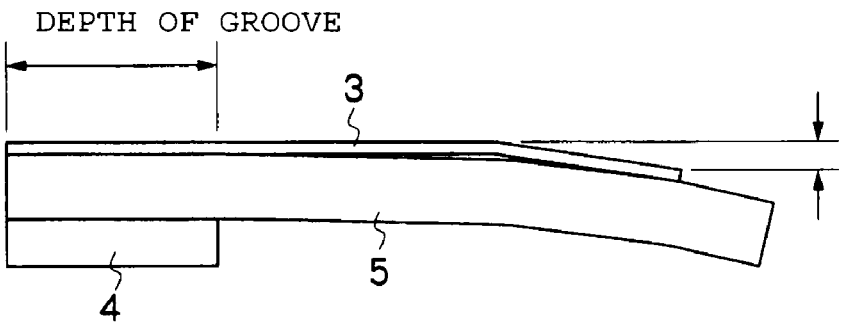
FIGS. 8(A) and 8(B) are schematic views illustrating a problem to be solved in Example 2.
Figure 8:
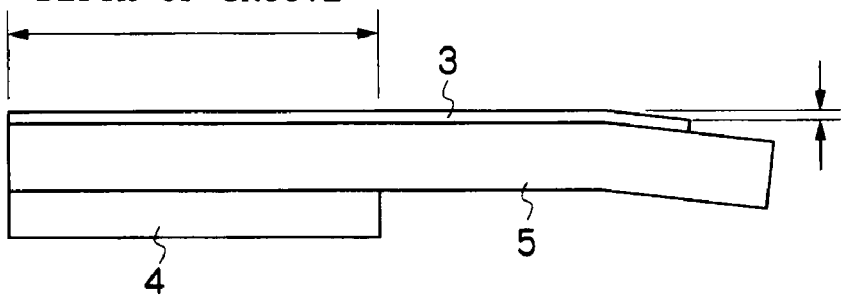

At this time, as shown in FIGS. 8(A) and 8(B), the magnitude of deflection of the heat treatment jig 5 changes according to the depth of the groove 4 and the two-dimensional shape of a surface of the groove 4 in contact with the heat treatment jig, and accordingly, it is preferred to make the shape of the supporting portion the same as the shape of a holding portion of a vertical heat treatment apparatus as described in the above second and fifth aspects. Namely, it is preferred that the shape of the supporting portion is made to be the same as the shape of the groove 4. This construction enables more accurate measurement of the heat treatment jig 5.

Figure 9:
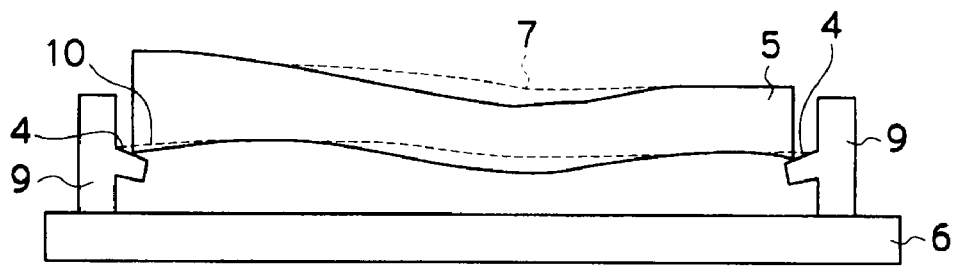
FIG. 9 is an explanation view showing a preferred embodiment of Example 2.

Further, as shown in FIG. 9, since a supporting portion 9 of an actually used holding tool constituted by a groove 4, is deflected by its own weight and by the weight of the heat treatment jig 5, in order to take this into consideration, it is preferred that the shape of the groove 4 of the supporting portion 9 on the measurement tool is the same. Further, it is more preferred that the material of the supporting member 9 be a material having the same or close Young's modulus as that of the actually used holding portion since Young's modulus determines deflection of the supporting portion 9. Here, in FIG. 9, a reference numeral 10 indicates a groove 4 that is not deflected.

EXAMPLE 2

Figure 14:
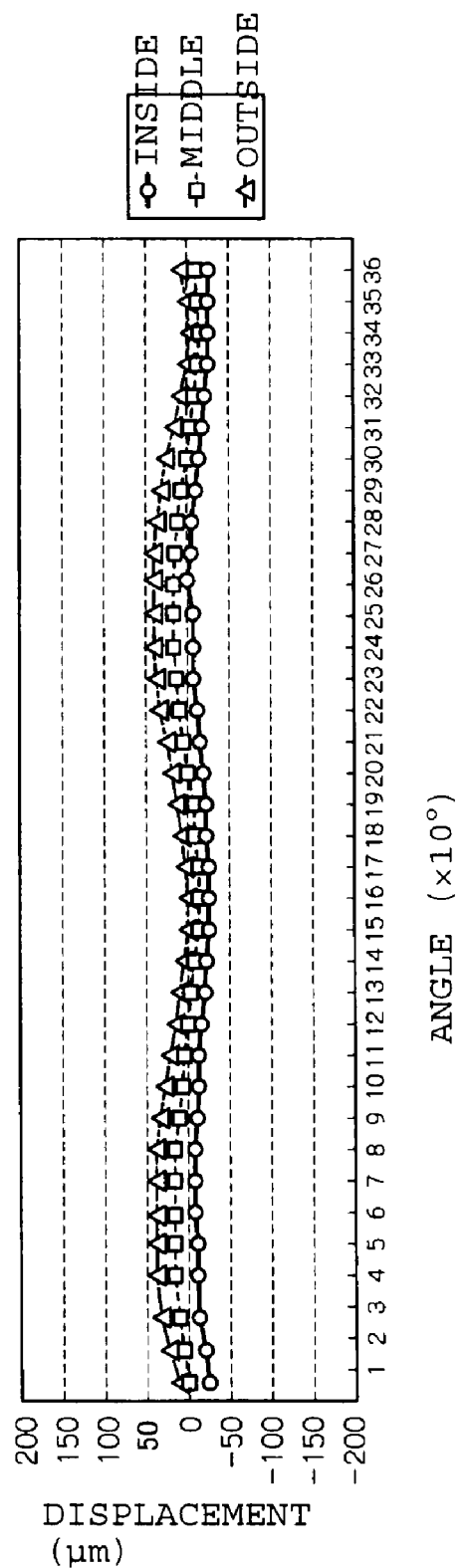
FIG. 14 is a graph showing comparison of measurement results using contact type detection tool.
Figure 15:
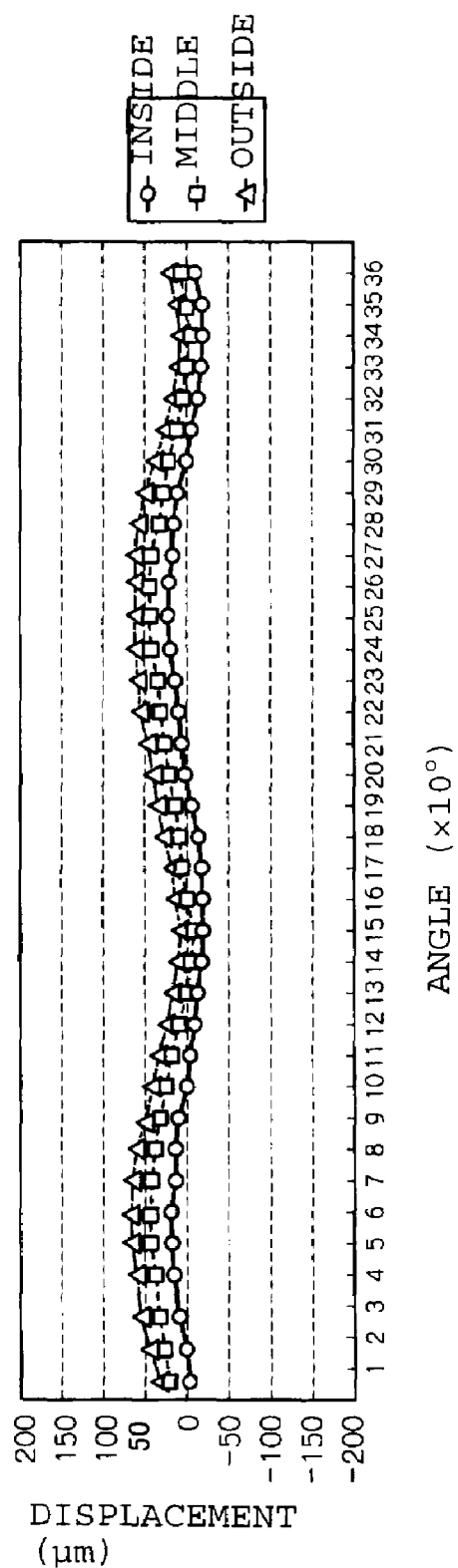
FIG. 15 is a graph showing comparison of measurement results using non-contact type detection tool.

The graph shown in FIG. 14 and the graph shown in FIG. 15 show the above-mentioned measurement methods, wherein FIG. 14 shows a case of using a contact type dial gauge as means for detecting shape and accuracy and FIG. 15 shows a case of using a laser reflection type displacement as means for detecting shape and accuracy. In each of FIG. 14 and FIG. 15, the lateral axis represents an angular position in a circumferential direction of the heat treatment jig 5, and the vertical axis represents displacement amount (deflection amount) in relation to the angular position in the circumferential direction.

The heat treatment jig 5 used in this measurement has an outer diameter of 320 mm, an inner diameter of 200 mm and a thickness of 2.5 mm, and its material is a sintered SiC coated with CVD-SiC of 50 μm thick. As the measurement tool, a flatness tester (model: KS990X) manufactured by Anritsu Corporation was used, and SiC supporting portions 9, 18 and 27 (refer to FIG. 7) each formed into a spherical shape having a radius of 10 mm, were provided at three positions at intervals of 90° on the stage, and a heat treatment jig 5 was placed thereon and measured.

Further, in each of these method, the measurement points were 36 positions at constant angular intervals on each of circles at 5 mm (outside), 15 mm (middle) and 25 mm (inside) respectively from the outer periphery of the heat treatment jig as shown in FIG. 11, and the results were plotted on the graph. Here, holding jigs used in the measurement of FIG. 15 are disposed under the measurement points 9, 18 and 27 of the heat treatment jig.

Figure 10:
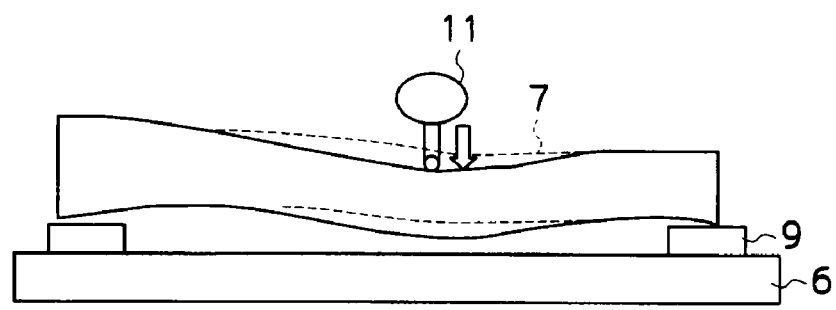
FIG. 10 is an explanation view showing a state of measuring a heat treatment jig by a contact type measurement tool.

Further, in the measurement of FIG. 14, a contact type dial gauge (model: 2046F) manufactured by Mitsutoyo Corporation is used as a detection tool, and in the measurement of FIG. 15, a non-contact type optical micrometer (model KL1301B) manufactured by Anritsu Corporation was used as a detection tool. Comparison of these results show that there is no measurement difference due to measurement pressure in the radial direction, but in the circumferential direction, the difference between wave shapes is small in the case of non-contact type, which indicates that more accurate measurement becomes possible in the non-contact type measurement. Accordingly, as the measurement means, a non-contact type measurement means is preferred as described in the third and sixth aspects. This reason is because as shown in FIG. 10, the heat treatment jig 5 is deformed by a contact pressure for measurement in the case of probe-contact type measurement tool 11, which prevents accurate measurement.

Figure 16:
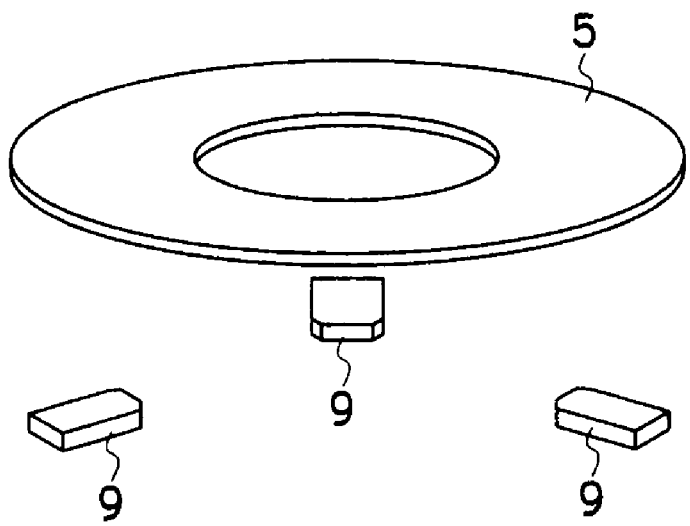
FIGS. 16(A) and 16(B) are explanation views showing measurement of heat treatment jig by non-contact type measurement means.
Figure 16:
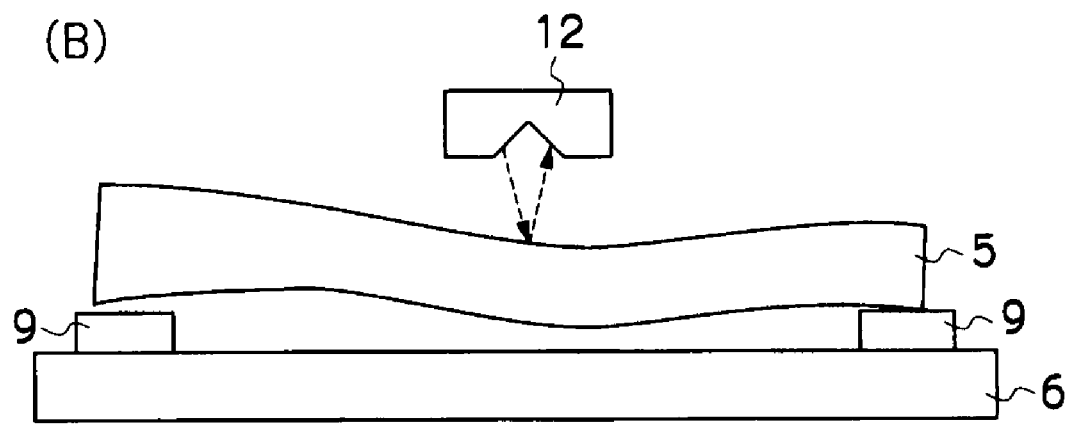

Further, as shown in FIG. 16(A), it is preferred to make the positions and the shape of the supporting portions 9 to be the same as the positions and the shape of the holding portions in a vertical heat treatment apparatus, and measure a deflection amount of the heat treatment jig 5 by non-contact type measurement means 12 in a state that the heat treatment jig 5 is supported by the supporting portions 9 as shown in FIG. 16(B). By this method, further accurate measurement becomes possible. As the non-contact type measurement means 12, a displacement meter using a laser or static capacitance or an optical interferometer may be used.

The present invention is suitably applicable to provide a method and an apparatus capable of easily and accurately measuring the shape of a heat treatment jig to be used for placing a wafer and used in a heat treatment apparatus in a semiconductor manufacturing process, to confirm that the shape is one capable of reducing occurrence of damages or crystal defects in a wafer.

The entire disclosure of Japanese Patent Application No. 2007-018393 filed on Jan. 29, 2007 including specification, claims, drawings and summary is incorporated herein by reference in its entirety.

What is claimed is:

1. A method for measuring the shape of a heating treatment jig to be held by a holding portion of a vertical heat treatment apparatus and to be used for placing a semiconductor wafer to be subjected to heat treatment, the method being characterized in that the shape of the heat treatment jig is measured in a state that the position of a supporting portion for supporting the heat treatment jig is set to be the same as the position of the holding portion for the heat treatment jig in the vertical heat treatment apparatus.

2. The method according to claim 1, wherein the shape of the supporting portion for supporting the heat treatment jig is the same as the shape of the holding portion for the heat treatment jig in the heat treatment apparatus.

3. The method according to claim 1 or 2, wherein means for measuring the shape of the heat treatment jig is non-contact type measurement means for measuring the heat treatment in a non-contact manner.

4. An apparatus for measuring the shape of a heat treatment jig to be held by a holding portion of a vertical heat treatment apparatus and to be used for placing a semiconductor wafer to be subjected to heat treatment, the apparatus being characterized in that the position of a supporting portion for supporting the heat treatment jig is the same as the position of the holding portion for the heat treatment jig in the vertical heat treatment apparatus.

5. The apparatus according to claim 4, wherein the shape of the supporting portion for supporting the heat treatment jig is the same as the shape of the holding portion for the heat treatment jig in the heat treatment apparatus.

6. The apparatus according to claim 4 or 5, wherein means for measuring the shape of the heat treatment jig is a non-contact type measurement means for measuring the heat treatment jig in a non-contact manner.

* * * * *